United States Patent
Herbst (10) Patent No.: US 11,474,178 B2
(45) Date of Patent: Oct. 18, 2022

(54) METHOD FOR GENERATING A MAGNETIC RESONANCE IMAGE

(71) Applicant: Bruker BioSpin MRI GmbH, Ettlingen (DE)

(72) Inventor: Michael Herbst, Gengenbach (DE)

(73) Assignee: BRUKER BIOSPIN MRI GMBH, Ettlingen (DE)

( * ) Notice: Subject to any disclaimer, the term of this patent is extended or adjusted under 35 U.S.C. 154(b) by 9 days.

(21) Appl. No.: 17/183,990

(22) Filed: Feb. 24, 2021

(65) Prior Publication Data

US 2021/0270918 A1    Sep. 2, 2021

(30) Foreign Application Priority Data

Feb. 28, 2020 (DE) ...................... 10 2020 202 576.2

(51) Int. Cl.
*G01R 33/48* (2006.01)
*G01R 33/56* (2006.01)
*G01R 33/561* (2006.01)

(52) U.S. Cl.
CPC ..... *G01R 33/4824* (2013.01); *G01R 33/5608* (2013.01); *G01R 33/5611* (2013.01)

(58) Field of Classification Search
CPC ............ G01R 33/4824; G01R 33/5608; G01R 33/5611
See application file for complete search history.

(56) References Cited

U.S. PATENT DOCUMENTS

| 10,191,133 B2 | 1/2019 | Beck et al. |
| 2006/0050981 A1 | 3/2006 | Huang |

(Continued)

FOREIGN PATENT DOCUMENTS

DE     10126078 B4    10/2002

OTHER PUBLICATIONS

Butts et al.: "Diffusion-Weighted Interleaved Echo-Planar Imaging with a Pair of Orthogonal Navigator Echoes", (Dec. 1995), pp. 763-770.

(Continued)

*Primary Examiner* — Gregory H Curran
(74) *Attorney, Agent, or Firm* — Edell, Shapiro & Finnan, LLC (57) ABSTRACT

A method for generating a magnetic resonance image includes providing MR segment data records, wherein each MR segment data record has N×M frequency voxels in k-space. To reduce the acquisition time during MR segment recordings, the amount of MR data is reduced by incompletely sampling the k-space during a recording. The missing data of the MR segment data records are reconstructed twice: Preliminarily reconstructed MR segment data records are calculated first, with a reconstruction kernel obtained from reference data. Modified reference images containing phase information are obtained by creating phase images from the preliminarily reconstructed MR segment data records and combining these phase images with the absolute value of the reference image generated from the reference data. The second reconstruction kernels are ascertained therefrom in turn. In contrast to the first reconstruction kernel, these contain phase information, such that the missing data can be reconstructed without phase artifacts.

16 Claims, 9 Drawing Sheets

(56) References Cited

U.S. PATENT DOCUMENTS

| | | | | |
|---|---|---|---|---|
| 2007/0182411 | A1* | 8/2007 | Bammer | G01R 33/56308 |
| | | | | 324/307 |
| 2010/0142823 | A1* | 6/2010 | Wang | G01R 33/5611 |
| | | | | 382/275 |
| 2015/0154741 | A1 | 6/2015 | Chen et al. | |
| 2015/0310641 | A1* | 10/2015 | Purdy | G01R 33/565 |
| | | | | 382/131 |
| 2019/0122398 | A1 | 4/2019 | Huang | |

OTHER PUBLICATIONS

Preibisch et al., "Comparison of Parallel Acquisition Techniques Generalized Autocalibrating Partially Parallel Acquisitions (GRAPPA) and Modified Sensitivity Encoding (mSENSE) in Functional MRI (fMRI) at 3T", Journal of Magnetic Resonance Imaging 27: pp. 590-598, (Jan. 2008).

Thunberg et al., "Noise distribution in SENSE- and GRAPPA-reconstructed images: a computer simulation study", Magnetic Resonance Imaging 25 (Nov. 2007), pp. 1089-1094.

Setsompop et al., "Blipped-Controlled Aliasing in Parallel Imaging for Simultaneous Multislice Echo Planar Imaging With Reduced g-Factor Penalty", Magnetic Resonance in Medicine 000:000-000 (Jun. 2011), 15 pages.

Uecker et al., "ESPIRIT—An Eigenvalue Approach to Autocalibrating Parallel MRI: Where SENSE Meets GRAPPA", Magnetic Resonance in Medicine 11:pp. 990-1001 (Mar. 2013).

* cited by examiner

METHOD FOR GENERATING A MAGNETIC RESONANCE IMAGE

CROSS REFERENCE TO RELATED APPLICATIONS

This application claims foreign priority under 35 U.S.C. § 119(a)-(d) to German Application No. 10 2020 202 576.2 filed on Feb. 28, 2020, the entire contents of which are hereby incorporated into the present application by reference.

FIELD OF THE INVENTION

The invention relates to a method for generating a magnetic resonance image of an object region, the magnetic resonance image having N×M image voxels, said method comprising:
a) providing at least n MR segment data records, wherein each MR segment data record has N×M frequency voxels in k-space, wherein each MR segment data record contains MR signal data for q frequency voxels and wherein, in each case, q<N×M and different MR segment data records contain MR signal data for different combinations of frequency voxels.

BACKGROUND

Such a method is known from [1].

Magnetic resonance imaging (MRI) is a widespread technique for obtaining images of the interior of an examination object noninvasively. The object region to be imaged can comprise a part of the examination object or else the entire examination object. By virtue of the object region being exposed to a substantially static and homogeneous main magnetic field in a magnetic resonance measuring apparatus, nuclear spins contained in a measurement volume of the examination object are oriented with respect to the direction of the main magnetic field, generally selected as z-direction of a magnet-bound coordinate system. The alignment of the magnetic dipole moments of the atomic nuclei connected therewith leads to a magnetization within the measurement volume in the direction of the main magnetic field. During the MR examination, this magnetization within the measurement volume is excited to carry out a precession movement as a result of being irradiated by electromagnetic RF pulses (RF: radiofrequency), the frequency of said precession movement being proportional to the local magnetic field strength. The vector of the magnetization is deflected from the equilibrium position through a flip angle. In currently employed MRI methods, a spatial encoding, generally referred to as location encoding, is impressed for all three spatial directions on the precession movements of the nuclear spins by time-varying superpositions of additional spatially dependent magnetic fields. The spatial encoding is usually described by a scheme in a space conjugate to the spatial domain by way of a Fourier transform, the so-called k-space. In this k-space formalism, the encoding can be described as the passage along a trajectory in k-space, the so-called k-space trajectory. MR signals are recorded when passing along the k-space trajectory. A data record is obtained, comprising N×M frequency voxels with MR signals, which are assigned to the frequency voxels.

To reduce the acquisition time during MR segment recordings, it is known to reduce the amount of MR data to be recorded by virtue of k-space being sampled incompletely during a recording with a plurality of detection coils (parallel imaging). Here, the detection coils can be present both physically and virtually. Virtual coils can be generated either from the combination of a plurality of physical coils or from individual physical coils with incorporation of the symmetry properties of k-space. Thus, fewer than N×M encoding steps are carried out and consequently a reduced data record (MR segment) is obtained for each coil, wherein all (preferably real) data records are recorded with the same encoding and consequently comprise MR data for the same frequency voxels. To obtain a complete image from such a reduced data record it is necessary to reconstruct the missing data.

[2] describes a method (GRAPPA) for parallel imaging, in which a reduced data record is respectively recorded for a plurality of detection coils. Calibration data points are additionally recorded in order to calculate a complete data record together with the actual measurement data. The reconstruction of a complete data record for a specific coil is implemented on the basis of the reduced data record of the corresponding coil and at least one further reduced data record of another coil. For this purpose, a reconstruction kernel is calculated by way of linear combinations of the recorded data of the incomplete data records, with the linear combinations being chosen such that the reference data represent the target functions for the linear combinations.

[3] discloses a GRAPPA method for reconstructing a time sequence, wherein information items from adjacent time frames are used for a common reconstruction.

Moreover, it may also be advantageous to successively record incomplete data records with different encodings, in particular for high-resolution MR imaging. In the process, k-space is sampled segment-by-segment and a plurality of incomplete data records (MR segment data records) are generated, which are subsequently combined (segmented imaging). As a rule, the various MR segment data records have different phases, for example on account of diffusion weighting. The various segments differ, on account of the different encodings, in the frequency of pixels for which MR data are recorded. In the ideal case, the segments complement one another such that, overall, measured MR data are available for each frequency voxel. The data of the individual MR segment data records could be plotted in uncorrected fashion in a fully sampled k-space and an image can be calculated using a Fourier transform FFT. A reconstruction would not be required in this case. However, these data records typically contain significant artifacts on account of the aforementioned phase differences. These phase differences can be corrected in different ways:

[4] has disclosed the practice of correcting the phase differences with navigators. Here, additional measurements are used to determine the phase of a segment. However, these have to be recorded in addition to the actual measurement and only yield restricted phase information.

Alternatively, it is possible to reconstruct the individual segments using a SENSE (sensitivity encoding) method [1] and thereby determine the phase angle of each segment. The coil sensitivities can be calculated from the unweighted (B0) images, which typically do not contain any artifacts. This phase information can then be used to combine all segments to form a magnitude image in a further "extended" SENSE reconstruction. To this end, the phases of the individual segments are integrated in an extended coil set. Thus, each segment obtains its dedicated virtual coils with dedicated phase angle. A disadvantage here is that the information items about the phase and the coil profiles are lost in the second reconstruction.

SUMMARY

It is an object of the invention to provide a method with which MR segments can be reconstructed without artifacts and without ascertaining navigators.

DESCRIPTION OF THE INVENTION

This object is achieved, according to one formulation of the invention, by a method that is characterized by:

b) calculating a first reconstruction kernel from a reference spectrum of the object region;

c) calculating n preliminarily reconstructed MR segment data records by reconstructing data missing in the respective MR segment data record within a k-space region specified for each MR segment data record with the first reconstruction kernel;

d) calculating a respective phase image from the preliminarily reconstructed MR segment data records with a Fourier transform;

e) calculating a reference image from the reference spectrum by way of a Fourier transform;

f) calculating n modified reference images by combining the absolute value of the reference image respectively with the phase of each of the phase images (abs(IR)*exp(i*angle (Pn)));

g) calculating n modified reference spectra with a Fourier transform of each of the modified reference images;

h) calculating n second reconstruction kernels, wherein each of the second reconstruction kernels is ascertained from all of the modified reference spectra for each of the MR segment data records;

i) ascertaining at least one finally reconstructed MR segment data record by reconstructing the missing data of preferably n MR segment data records with the second reconstruction kernels and the MR signal data of the corresponding MR segment data records; and j) calculating the magnetic resonance image from the at least one finally reconstructed MR segment data record.

Here, q describes the number of encoding steps for ascertaining an MR segment data record. Here, q can be different for different segments. That is to say, it is not necessary for all segments to have the same amount of signal data or comprise signal data for the same voxels.

Thus, q corresponds to the number of frequency voxels, for which MR signal data (preferably FID or echo signals) are measured. It should be noted here that no discrete phase encodings are measured in this case. Rather, a continuous signal is measured, which is split into discrete compartments. Preferably, at least part of the measured signal has phase encoding "near" zero (i.e. no/little dephasing and hence a maximum signal).

n describes the number of MR segment data records and N×M describes the number of voxels of an MR segment data record (frequency voxels in k-space or image voxels in the image space).

MR segment data records contain intensity values (MR signal data) for various k×y values of k-space. The MR signal data can be obtained within the scope of an MR measurement. MR segment data records are preferably "undersampled" MR spectra, i.e., MR spectra which were generated by the undersampling of k-space or by splitting an already recorded MR spectrum.

Although each MR segment data record contains N×M voxels, undersampled MR segment data records comprise a measured intensity value only for q frequency voxels, where q need not be the same for all MR segment data records. The intensity values for the remaining voxels must be reconstructed. Different MR segment data records contain intensity values for different combinations of k×y values; i.e., different regions of k-space are sampled (different encoding) when different MR segment data records are ascertained. However, there can be k×y values for which intensity values are available in a plurality of MR segment data records. In the case of a spiral encoding, for example, the center voxel of the spiral is contained in each segment data record. Preferably, the MR segment data records complement one another in such a way that, overall, there is at least one measured intensity value for each k×y value of k-space.

Preferably, preliminarily reconstructed MR segment data records are calculated in step c) for all MR segment data records provided. However, in principle, it would also be possible to exclude individual MR segment data records, for example if the signal-to-noise ratio SNR in one MR segment data record were to deviate significantly from the SNR in other segment data records or if a displacement of the k-space center is indicative for a movement. However, to be able to calculate a valid reconstruction kernel, all MR segment data records (here: n) used in the final reconstruction (step i)) need to be reconstructed to be able to calculate a valid second reconstruction kernel.

A reconstructed MR segment data record contains measured intensity values for those k×y values that were sampled and contains calculated (reconstructed) intensity values for those k×y values that were not sampled.

A reconstruction kernel serves to reconstruct MR signal data (intensity values in k-space) from undersampled data records which result from an MR measurement in which k-space was not sampled completely (MR segment data records). The reconstruction kernel comprises the rule regarding how the frequency voxels of the MR segment data records should be taken into account when reconstructing the i-th segment data record. The reconstruction kernel is generated by virtue of the influence of recorded MR signal data on a frequency voxel to be reconstructed being ascertained with the aid of reference data (reference spectrum) for each frequency voxel to be reconstructed in k-space. Consequently, it is possible to reconstruct all frequency voxels that were not recorded. By way of example, such a reconstruction method is known from [2].

The reference spectrum is a complete (at least in the low-frequency region) MR signal data record (completely sampled contiguous k-space region), which is preferably recorded just before or during the measurement of the MR segment data records to be reconstructed. Thus, the reference spectrum is preferably generated by capturing MR signal data by complete sampling, for example of the k-space center.

According to the invention, the missing data of the MR segment data records are reconstructed twice: Preliminarily reconstructed MR segment data records are calculated first, to be precise with a reconstruction kernel obtained from reference data, as known from [2]. Modified reference images containing phase information are obtained by creating phase images from the preliminarily reconstructed MR segment data records and combining these phase images with the absolute value of the reference image generated from the reference data. The second reconstruction kernels are ascertained therefrom in turn; in contrast to the first reconstruction kernel, these contain phase information. In this way, the missing data of the MR segment data records can be reconstructed without phase artifacts.

To calculate the second reconstruction kernel for the i-th MR segment data record, frequency voxels from all modified reference spectra are preferably taken into account in order to reconstruct the frequency voxels to be reconstructed of the i-th MR segment data record. Thus, the influence of frequency voxels of preferably all modified reference spectra on the frequency voxels to be reconstructed in the i-th MR segment data record is taken into account. Here, frequency voxels located in the direct surroundings of the frequency voxel to be reconstructed are preferably selected.

In principle, the system of equations for the second reconstruction step is the same as for the first, specifically:

$$K=P_t*\mathrm{Inv}(P_s)$$

Here, K denotes the reconstruction kernel, Pt denotes the set of target points (voxels to be reconstructed), Ps denotes the set of reference points (voxels with measured MR signal data) and Inv denotes an inverse operation. Both sets are subsets of the reference data. In the second reconstruction step, the target and reference points are selected from the generated reference data of all segment data records.

In a specific method variant, the calculation of the n second reconstruction kernels is carried out with the modified reference spectra and additionally with a selected reference spectrum in step h). A finally reconstructed MR segment data record is ascertained in step i) and the magnetic resonance image is generated in step j) by a Fourier transform of the finally reconstructed MR segment data record. In this method variant, the target points for the kernel calculation are chosen exclusively from the selected reference spectrum. The reference points are selected from all modified reference spectra. As a result, a magnetic resonance image with the phase of the selected reference spectrum is reconstructed thereby. This method variant allows the magnetic resonance image to be ascertained from only a single finally reconstructed MR segment data record. Therefore, no segment images need to be generated.

Preferably, the selected reference spectrum is the reference spectrum originally provided or one of the modified reference spectra. The target points differ depending on what spectrum (reference spectrum or modified reference spectrum) the selected reference spectrum is. Independently of the choice of the selected reference spectrum, the reference points can always be chosen to be the same.

By using the selected reference spectrum, only a single finally reconstructed MR segment data record needs to be calculated in order to generate a phase artifact-free magnetic resonance image.

However, provision can alternatively also be made for n finally reconstructed MR segment data records to be ascertained in step i) and for a segment image to be initially generated in step j) by a Fourier transform for each finally reconstructed MR segment data record and the segment images to be subsequently combined to form the magnetic resonance image. This method variant is particularly suitable if the calculation of the n second reconstruction kernels in step h) is only carried out with the modified reference spectra (without an additionally selected reference spectrum). The n segment images then differ in terms of their phase and are therefore combined, with "combined" meaning, in particular, summing of the amplitude values of the corresponding image voxels of the n segment images.

The provision of the n MR segment data records in step a) is preferably implemented by measuring at least one MR spectrum, wherein an MR sequence with an excitation pulse is run through for recording each MR spectrum, as a result of which nuclear spins are excited within the object region. k-space sampling to be carried out for measuring the MR spectrum can be implemented, for example, in lines (EPI—Echo-Planar Imaging, RARE—Rapid Acquisition with Relaxation Enhancement) or in spiral fashion. The excitation pulse is a selective RF excitation pulse, preferably a slice-selective excitation pulse (single slice or multi-slice). The measured MR spectra are stored for further processing.

Preferably, the MR sequences for the individual MR segment data records are interleaved (multishot interleaved pulse sequence), i.e., the segment data records are recorded in temporally interleaved fashion. In the case of an "interleaved recording", data are recorded, e.g., line-by-line, with the lines of different MR segment data records being recorded alternately.

In a special method variant, an MR spectrum is recorded in step a), preferably with signal data for M×N frequency voxels. The recorded MR spectrum is stored and, for the purposes of providing the MR segment data records, split into the latter. Thus, an MR spectrum which is preferably fully sampled is recorded in this method variant; i.e., there preferably is a measured MR signal for each frequency voxel. Then, the measured MR spectrum is split into a plurality of MR segments. Use can be made of a single measured MR spectrum or else of a plurality of measured MR spectra, which are then each split into a plurality of MR segments. The MR segment data records required for the method according to the invention are then generated by virtue of the measured fully sampled MR spectrum being split into a plurality of "undersampled partial spectra" (MR segment data records). This can be advantageous if "ghost" artifacts are present in the recorded MR spectrum, for example when carrying out an EPI method, in which there is a displacement of the NMR data in k-space depending on the scanning direction.

The division of a measured MR spectrum into a plurality of MR segment data records can also be implemented for the case of an incompletely measured MR spectrum (i.e., with signal data for fewer than M×N frequency voxels). The various encodings lead to the different combinations of frequency voxels, and so the various MR segments differ in respect of the frequency voxels for which the signal data are present.

Preferably, an EPI sequence is used as an MR sequence and the subdivision into MR segment data records is implemented by splitting the MR signals in accordance with their sampling direction in k-space. In an EPI sequence, k-space is sampled in meandering fashion, with successive lines of k-space being sampled in different directions. By way of example, a first MR segment data record comprising all even lines of k-space and a second MR segment data record comprising all odd lines of k-space would be an advantageous split of the measured MR spectrum.

In another method variant, a plurality of MR spectra, preferably n MR spectra, are recorded with q<M×N, wherein different encodings are used for each excitation pulse. Thus, a plurality of undersampled MR spectra are measured, which each form at least one MR segment data record. The MR sequence for an MR segment data record preferably comprises a single excitation pulse. Thus, the number of excitation pulses preferably corresponds to the number of MR segment data records. However, it is also possible to generate a plurality of MR segment data records from one measured MR spectrum (number of excitation pulses<number of segment data records).

To obtain even better phase information, it is advantageous to repeat steps d) to i), wherein, in repeated step d), the finally reconstructed MR segment data records from the previously carried out step i) are used instead of the preliminarily reconstructed MR segment data records. A finally reconstructed MR segment data record must be calculated for each MR segment data record for this method variant, even if the magnetic resonance image is generated from only a single finally reconstructed MR segment data record.

Preferably, the specified k-space region in step c) comprises all N×M frequency voxels. Thus, the preliminarily reconstructed MR segment data records are then reconstructed in the entire k-space.

Preferably, the specified k-space region in step c) comprises a low-frequency portion of k-space. Thus, the MR segment data records are then predominantly preliminarily reconstructed in the central (low-frequency) region.

As an alternative thereto, provision can be made for the k-space region specified in step c) to comprise portions of k-space in which the corresponding MR segment data record has peaks (local maxima of the amplitude values).

In a specific variant of the method according to the invention, a movement of the object region between the recording of the individual MR segment data records is corrected with the preliminarily reconstructed MR segment data records. The correction is substantially implemented by virtue of comparing the preliminarily reconstructed MR segment data records with the reference spectrum.

An advantageous variant of the method according to the invention provides for the phase images to be smoothed in step d) with an x-space/image-space filter and/or for the preliminarily reconstructed MR segment data records to be smoothed in step d) with a k-space filter. By way of example, a Gaussian filter can be used as an x-space/image-space filter. By way of example, a low pass filter or Gaussian filter can be used as a k-space filter.

Further advantages of the invention are apparent from the description and the drawing. The aforementioned features and the features mentioned further below can likewise be employed, according to the invention, in each case by themselves or in any desired combination. The embodiments shown and described should not be understood to be an exhaustive list, but rather have an exemplary character for the purpose of illustrating the invention.

DETAILED DESCRIPTION

Figure 1:
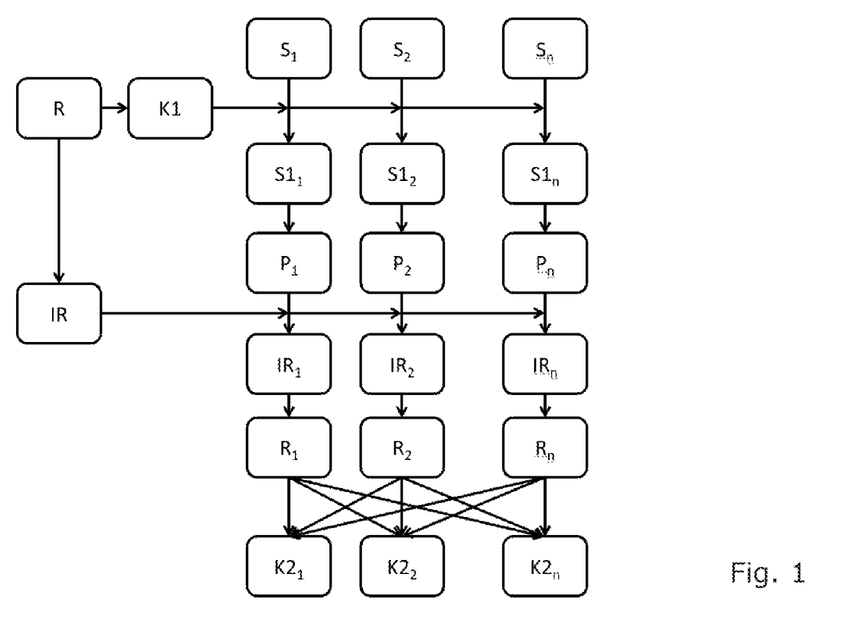
FIG. 1 shows a flowchart for ascertaining second reconstruction kernels as per a first variant of the method according to the invention.
Figure 2:
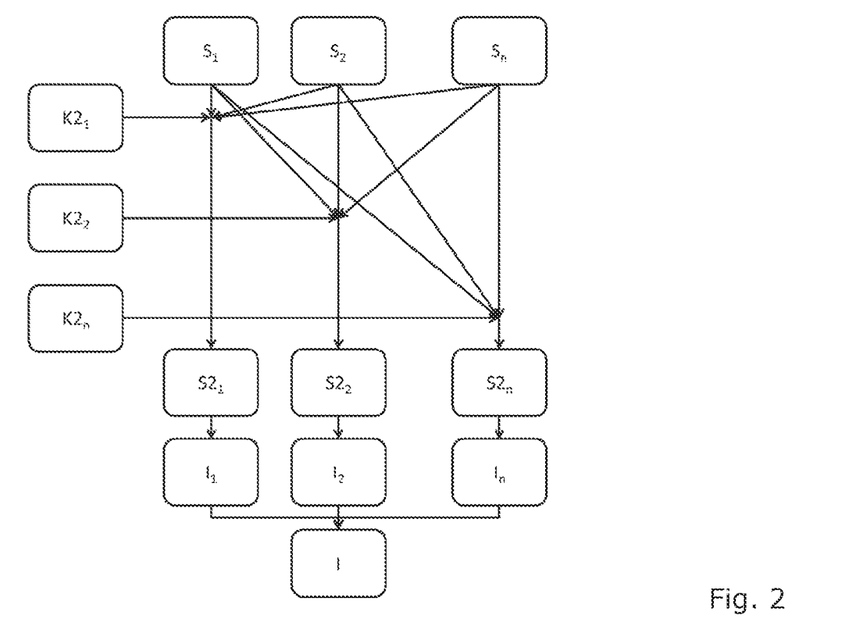
FIG. 2 shows a flowchart for ascertaining a magnetic resonance image with the second reconstruction kernels ascertained in FIG. 1.
Figure 3:
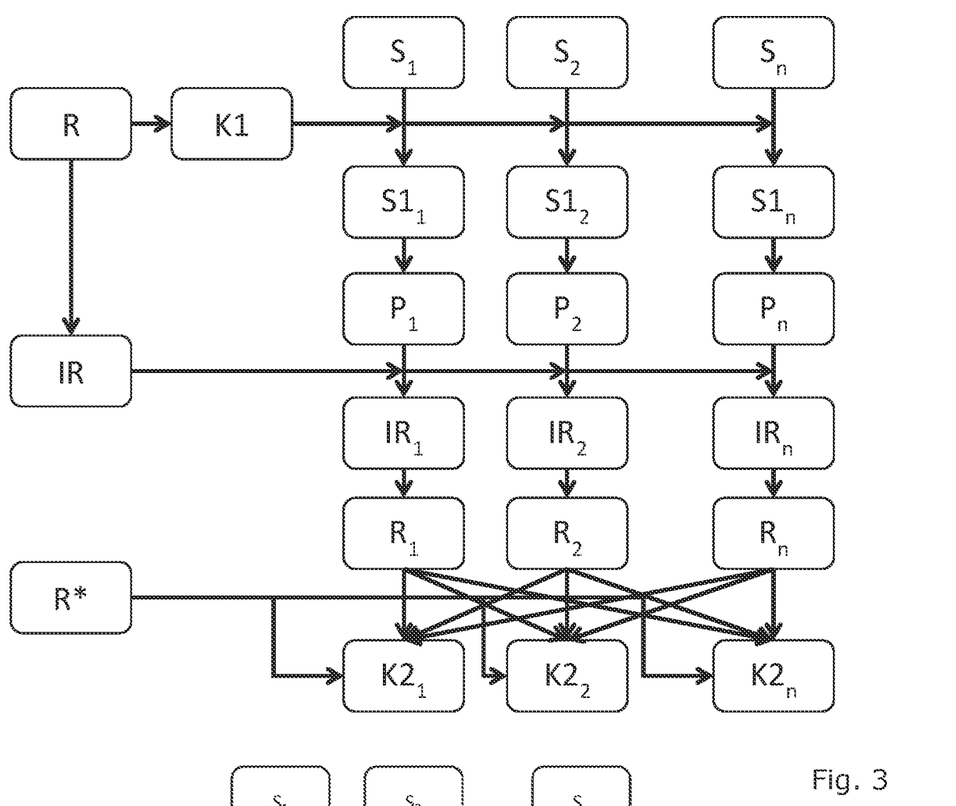
FIG. 3 shows a flowchart for ascertaining second reconstruction kernels as per a second variant of the method according to the invention using an additionally selected reference spectrum.
Figure 4:
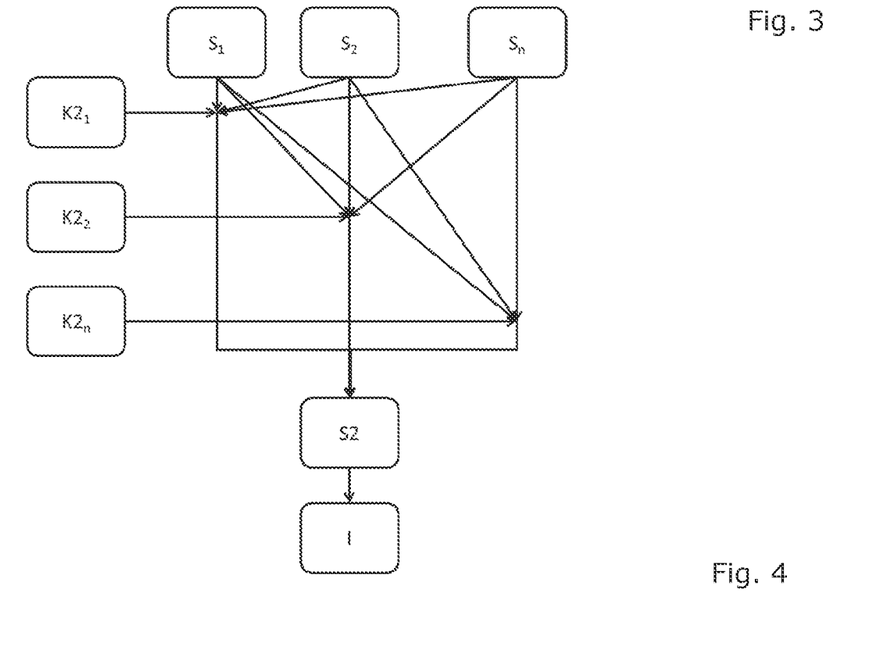
FIG. 4 shows a flowchart for ascertaining a magnetic resonance image with the second reconstruction kernels ascertained in FIG. 3.

FIG. 1 and FIG. 2 show a first variant of the method according to the invention and FIG. 3 and FIG. 4 show a second variant of the method according to the invention. In both variants of the method, a magnetic resonance image I is ascertained according to the invention from various MR segment data records S1, S2, Sn provided.

Figure 5:
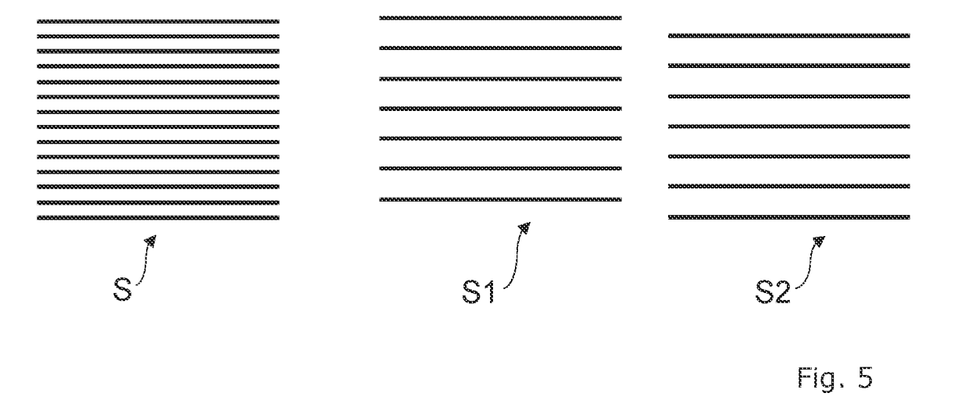
FIG. 5 schematically shows a split of a recorded data record of an MR spectrum into various MR segment data records.

The various MR segment data records S1, S2, Sn can be recorded individually or, as shown in exemplary fashion in FIG. 5, can be obtained by splitting the recorded MR spectrum S into various data records S1, S2. In the example shown in FIG. 5, k-space was sampled line-by-line. The MR segment data records S1 and S2 each comprise data of every second line, with the first MR segment data record S1 comprising all even lines and the second MR segment data record comprising all odd lines.

Figure 6:
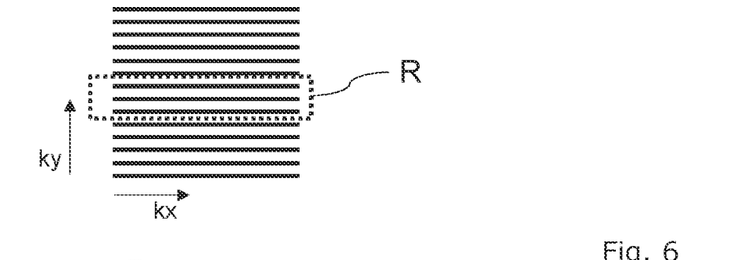
FIG. 6 schematically shows a reference data record.
Figure 7:
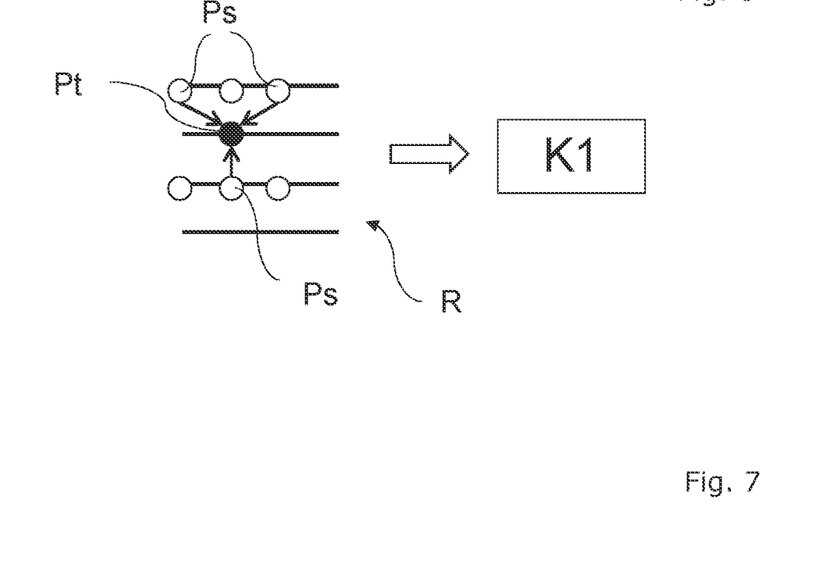
FIG. 7 shows the involvement of target and reference points of the reference spectrum when ascertaining the first reconstruction kernel.

Within the scope of the method according to the invention, a first reconstruction kernel K1 is ascertained firstly from a reference spectrum R for both method variants. The reference spectrum R comprises MR signal data by complete sampling, for example of the k-space center. The reference spectrum R shown in FIG. 6 for example contains all frequency voxels in the kx-direction while it only contains frequency voxels in the low-frequency region, i.e., from the k-space center, in the ky-direction. The first reconstruction kernel K1 is ascertained by virtue of ascertaining a mathematical relationship (linear combination) of reference points Ps and target points Pt within the reference spectrum R, as illustrated schematically in FIG. 7. The voxels of the reference spectrum R corresponding to the voxels of the MR segment data records which should be reconstructed are selected as target points Pt; voxels of the reference spectrum R which correspond to voxels of the MR segment data records for which MR signal data are available are selected as reference points Ps. A plurality of reference points Ps contribute to the calculation of each target point Pt. The size of the reconstruction kernel K1 is determined from the number of contributing reference points Ps. Thus, linear combinations are calculated on the basis of the reference data, with the target points Pt of the reference data representing the target functions for the linear combination. The reconstruction kernel K1 is the best solution to this equation. The first reconstruction kernel K1 is only calibrated/calculated in the region of k-space in which the reference spectrum R was recorded, i.e., in the region for which fully sampled reference data are available. In the example shown in FIG. 6, only reference data from low-frequency regions of k-space (k-space center) are used as spectrum. This is advantageous, in particular, if the data contain much noise in the high frequency range. Nevertheless, the first reconstruction kernel K1 thus ascertained is valid for the entire k-space.

Figure 8:
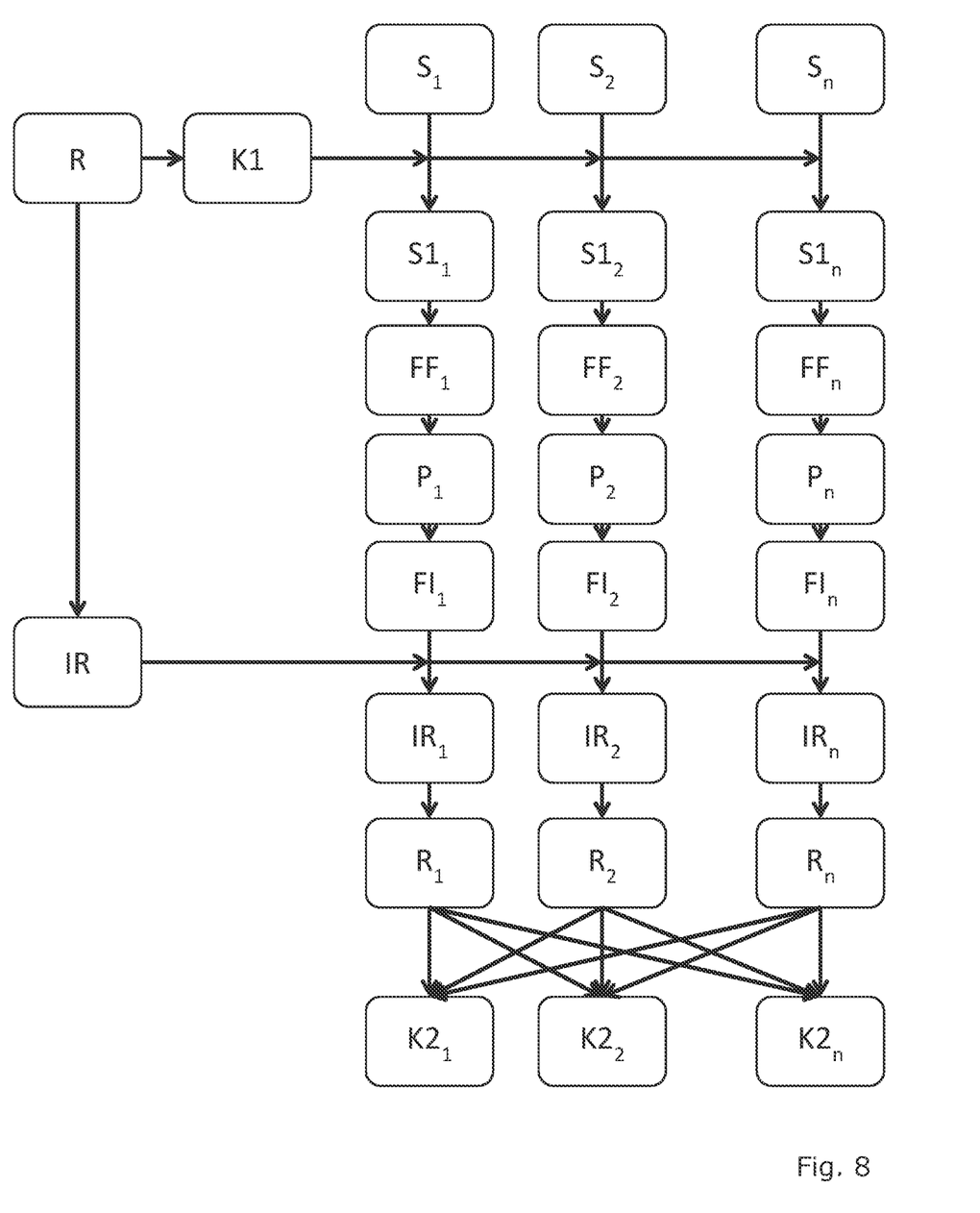
FIG. 8 shows the flowchart from FIG. 1 using x-space and k-space filters.
Figure 9:
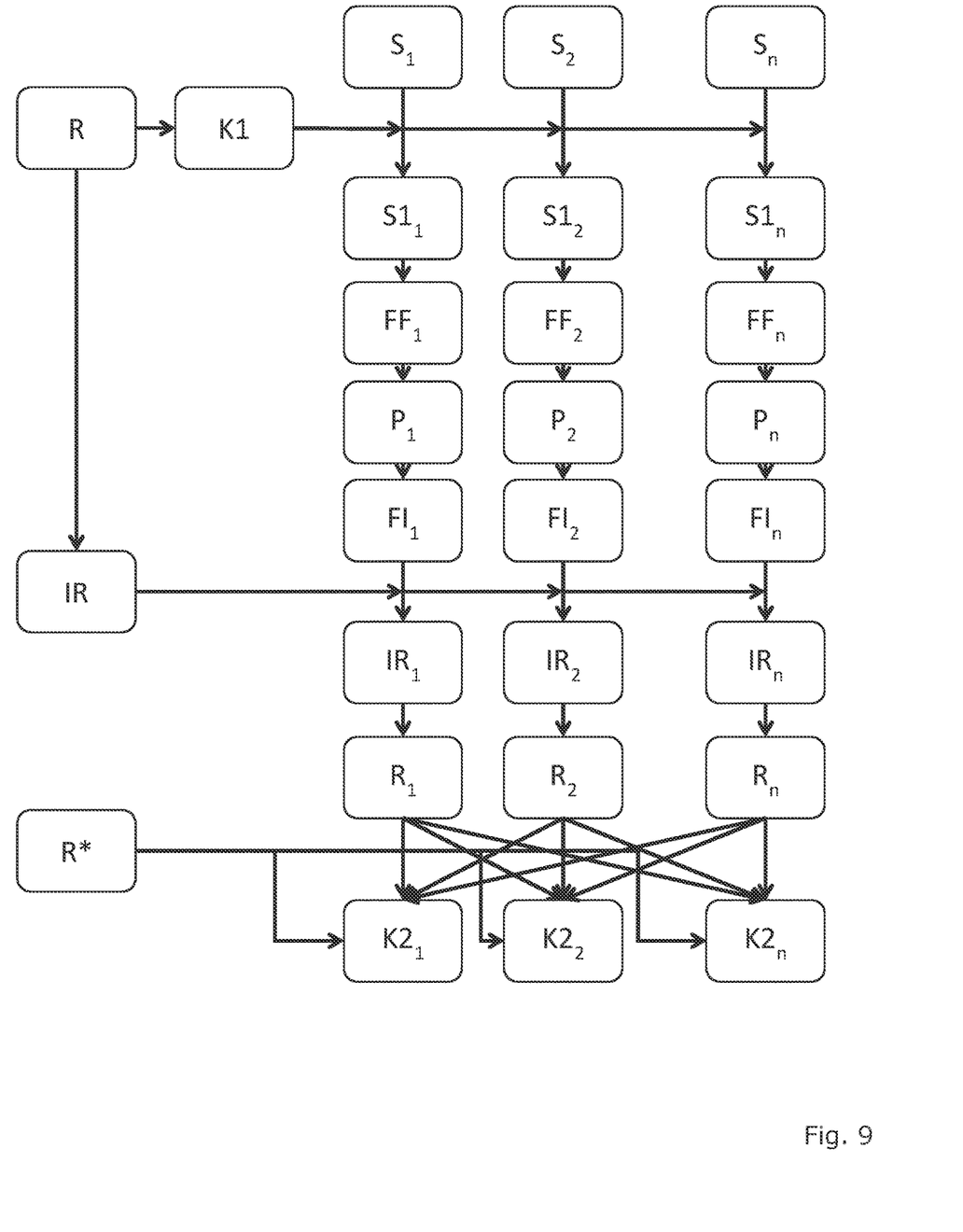
FIG. 9 shows the flowchart from FIG. 3 using x-space and k-space filters.

FIG. 1 and FIG. 3 show that preliminarily reconstructed MR segment data records S1.1, S1.2, S1.n are reconstructed from the individually recorded and stored MR segment data records S1, S2, Sn using the first reconstruction kernel K1 generated from the reference spectrum R. Phase images P1, P2, Pn for each MR segment data record S1, S2, Sn are ascertained from these preliminarily reconstructed MR segment data records S1.1, S1.2, S1.n. The preliminarily reconstructed MR segment data records S1.1-S1.n can be smoothed with k-space filters FF1, FF2, FF3 and the phase images P1, P2, P3 can be smoothed with x-space filters F11, F12, F13, as shown in FIG. 8 and FIG. 9 for the two method variants shown in FIG. 1 and FIG. 3. The phase images P1, P2, Pn of the individual MR segment data records S1, S2, Sn can then be combined with the absolute value of the Fourier transforms of the reference data (reference image IR) in order to obtain modified reference spectra R1, R2, Rn for each MR segment data record S1, S2, Sn.

Figure 10:
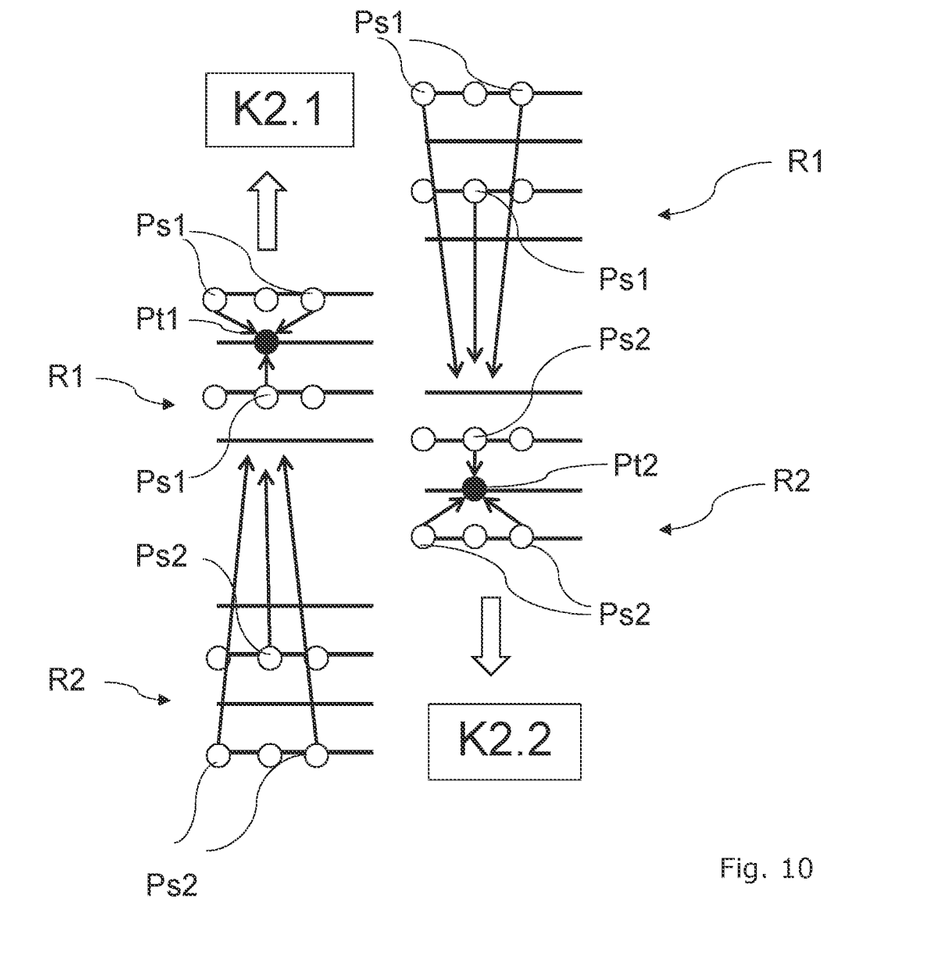
FIG. 10 shows the involvement of target and reference points of various modified reference spectra when ascertaining the second reconstruction kernel as per the first method variant.
Figure 12:
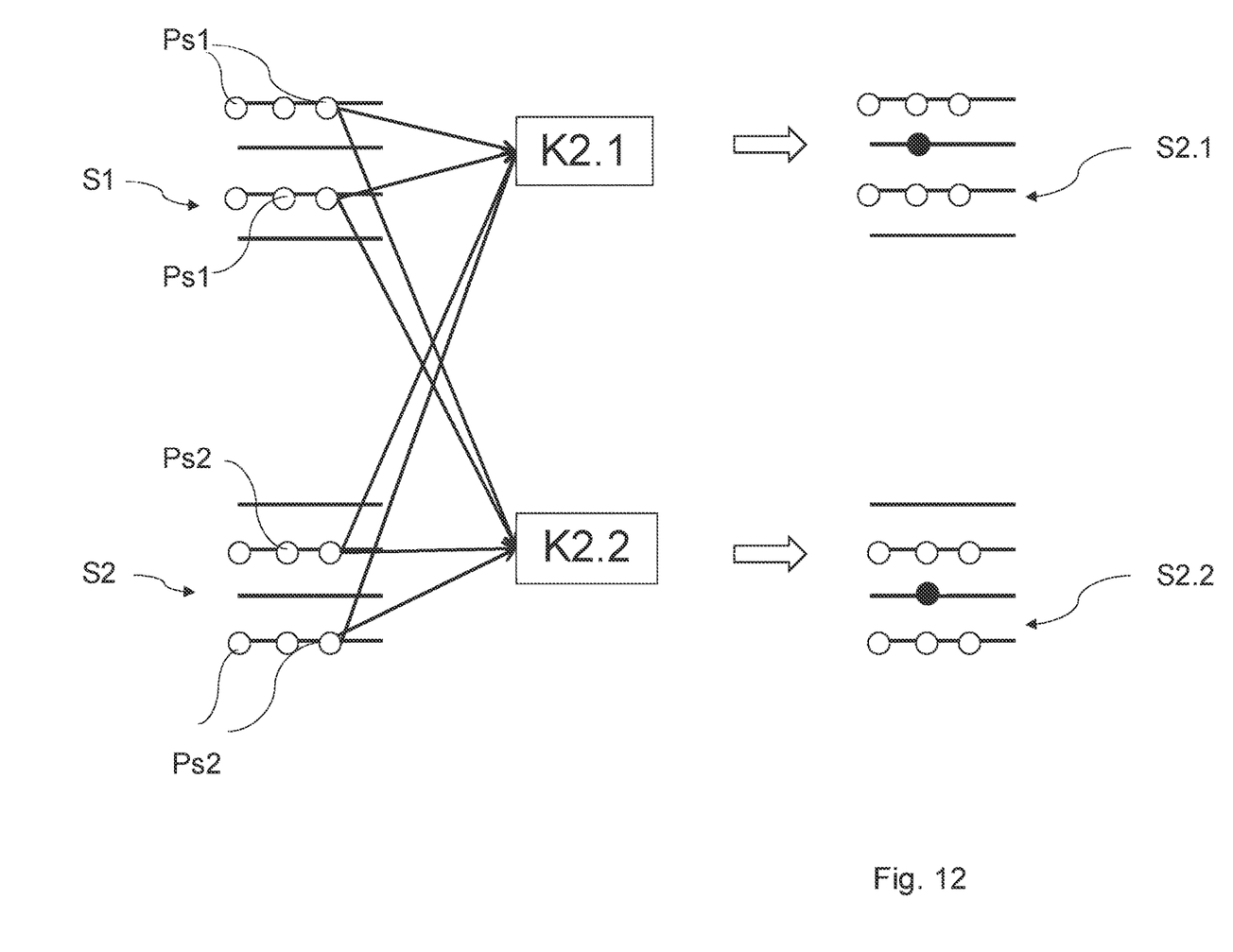
FIG. 12 shows the ascertainment of two finally reconstructed data records as per the first method variant.

In the first method variant, a kernel set with second reconstruction kernels K2.1, K2.2, K2.n is subsequently calculated, a second reconstruction kernel K2.1, K2.2, K2.n preferably being ascertained for each MR segment data record S1, S2, Sn as shown in FIG. 1. In contrast to the calculation of the first reconstruction kernel K1, data from a plurality of reference spectra, specifically from all modified reference spectra R1, R2, Rn, are taken into account during the calculation of the second reconstruction kernel K2.1, K2.2, K2.n, as illustrated schematically in FIG. 10 for two modified reference spectra R1, R2. In the example shown in FIG. 10, a relationship between target points Pt1 of the first modified reference spectrum R1 and both reference points Ps1 from the first modified reference spectrum R1 and reference points Ps2 from the second modified reference spectrum R2 are ascertained for the ascertainment of the second reconstruction kernel K2.1. In a manner analogous thereto, a relationship between target points Pt2 of the second modified reference spectrum R2 and both reference points Ps2 from the second modified reference spectrum R2 and reference points Ps1 from the first modified reference spectrum R1 are ascertained for the ascertainment of the second reconstruction kernel K2.2. Otherwise, the calculation of the second reconstruction kernel K2.1, K2.2, K2.n is carried out in a manner analogous to the calculation of the first reconstruction kernel K1. For n=2, FIG. 12 schematically shows the ascertainment of the second reconstruction kernel K2.1, K2.2 and the finally reconstructed MR data records S2.1, S2.2 ascertained therewith.

FIG. 2 shows how the set of second reconstruction kernels K2.1, K2.2, K2.n is used in the first method variant to reconstruct finally reconstructed MR segment data records S2.1, S2.2, S2.n. Here, a finally reconstructed MR segment data record S2.1, S2.2, S2.n is a generated for each MR segment data record S1, S2, Sn by virtue of using data from all MR segment data records S1, S2, Sn in accordance with the calculation rule stored in the respective second reconstruction kernel K2.1, K2.2, K2.n. Thus, for example, the reconstruction of the finally reconstructed MR segment data record S2.1 is carried out with the second reconstruction kernel R1 and data from all MR segment data records S1, S2, Sn.

Then, a respective segment image I1, I2, I3 is calculated from the finally reconstructed MR segment data records S2.1, S2.2, S2.n. Said segment images are finally combined to form an overall image (magnetic resonance image I).

Figure 11:
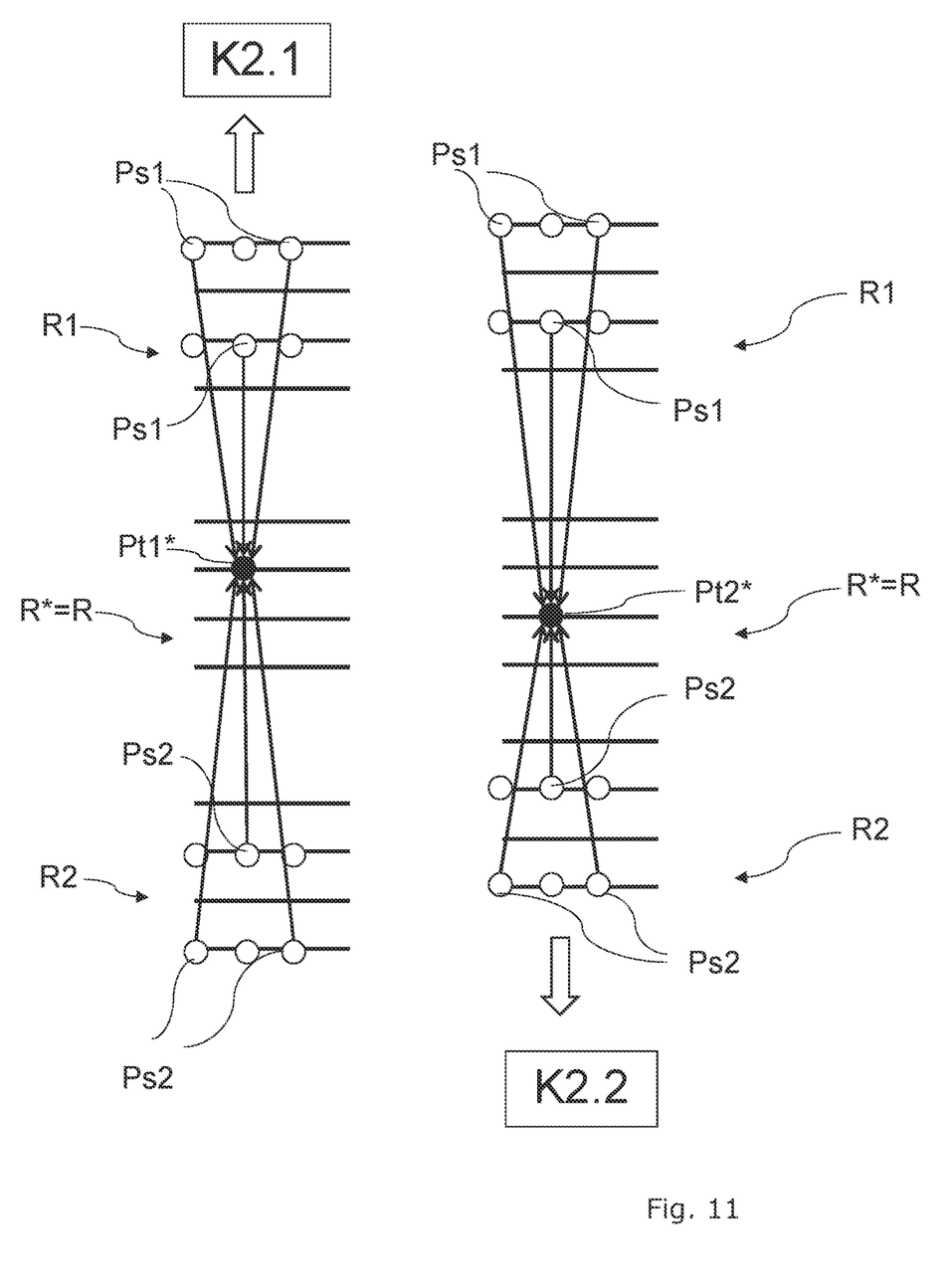
FIG. 11 shows the involvement of reference points of various modified reference spectra and of target points of a selected reference spectrum when ascertaining the second reconstruction kernel as per the second method variant.

A second reconstruction kernel K2.1, K2.2, K2.n is likewise ascertained for each MR segment data record S1, S2, Sn in the second method variant, as shown in FIG. 3. In contrast to the first method variant, additional data of a selected reference spectrum R* are used in addition to the data from the modified reference spectra R1, R2, Rn during the calculation of the second reconstruction kernels K2.1, K2.2, K2.n in accordance with the second method variant: Target points Pt1*, Pt2* for the kernel calculation are selected from the selected reference spectrum R*, wherein the target points Pt1* describe voxels from the selected reference spectrum R* which were not measured in the first MR segment data record S1 and the target points Pt2* describe voxels which were not measured in the second MR segment data record S2. The reference points Ps1, Ps2 are chosen from the modified reference spectra R1, R2, Rn, as illustrated schematically in FIG. 11 for two modified reference spectra R1, R2. Here, the reference spectrum R was chosen as selected reference spectrum R*. However, one of the modified reference spectra R1, R2, Rn can also be used as selected spectrum R*. Thus, in the example shown in FIG. 11, target points Pt1* from the selected reference spectrum R*, reference points Ps1 from the first modified reference spectrum R1 and reference points Ps2 from the second modified reference spectrum R2 are used for the calculation of the kernel K2.1. In a manner analogous thereto, target points Pt2* from the selected reference spectrum R* and both reference points Ps2 from the second modified reference spectrum R2 and reference points Ps1 from the first modified reference spectrum R1 are used for the calculation of the kernel K2.2. Thus, each of the second reconstruction kernels K2.1, K2.2, K2.n contains information from all MR segment data records S1, S2, Sn. Otherwise, the calculation of the second reconstruction kernel K2.1, K2.2, K2.n is also carried out in a manner analogous to the calculation of the first reconstruction kernel in this case.

FIG. 4 shows how these second reconstruction kernels K2.1, K2.2, K2.n are used in the second method variant to reconstruct a finally reconstructed MR segment data record S2 with the phase angle of the selected reference spectrum R*. Here, data from all MR segment data records S1, S2, Sn are used in accordance with the calculation rule stored in the second reconstruction kernels K2.1, K2.2, K2.n. Thus, the reconstruction of the finally reconstructed MR segment data record S2 is carried out with all of the second reconstruction kernels K2.1, K2.2, K2.n and data from all MR segment data records S1, S2, Sn. Then, the magnetic resonance image I is calculated from the finally reconstructed MR segment data record S2 by way of a Fourier transform.

In contrast to the first method variant, the target points Pt1*, Pt2* for calculating the second reconstruction kernel are all selected from the same reference spectrum R* within the scope of the second method variant. As a result, a magnetic resonance image I with the phase of the selected reference spectrum R* is reconstructed thereby.

Figure 13:
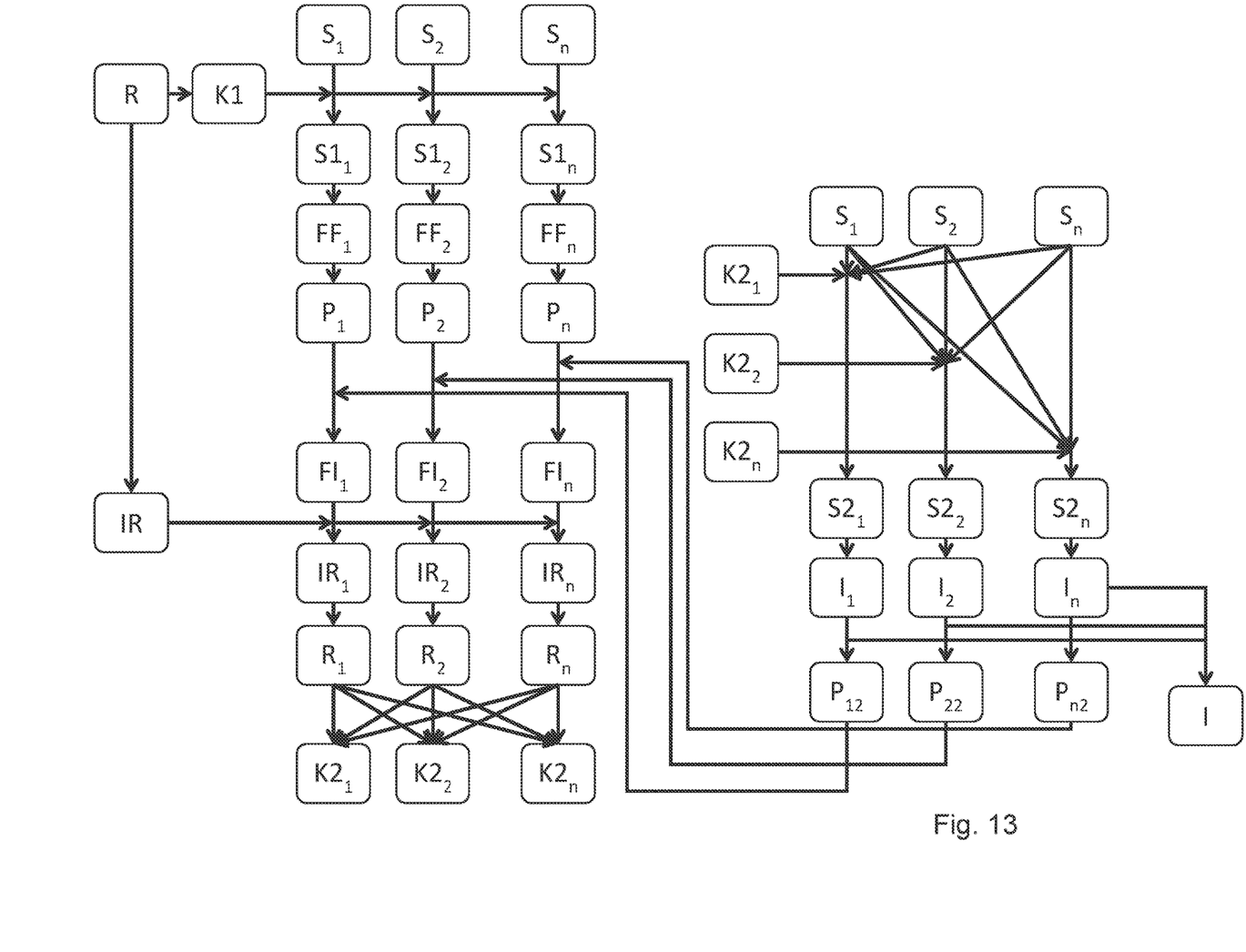
FIG. 13 shows a flowchart of the first variant of the method according to the invention, wherein finally reconstructed MR segment data records are used to calculate new second reconstruction kernels.

In the first method variant, the finally reconstructed MR segment data records S2.1, S2.2, . . . , S2.n can be used to calculate new second reconstruction kernels and carry out the method steps shown in FIG. 2 or FIG. 4 using these newly calculated second reconstruction kernels, as shown in exemplary fashion for the first method variant in FIG. 13. Using this, even better phase information can be obtained for both method variants.

In the method according to the invention, the phases of the various MR segment data records are taken into account during the reconstruction without having to carry out additional measurements for ascertaining the phase. By introducing, according to the invention, the phase information into the modified reference spectra R1, R2, Rn and by taking account of all modified reference spectra R1, R2, Rn when creating the second reconstruction kernels K2.1, K2.2, K2.$n$, the phase information items of the individual MR segment data records S1, S2, Sn are already taken into account in the finally reconstructed MR segment data records S2; S2.1, S2.2, S2.$n$. As a result, phase artifacts can be efficiently avoided.

CITATIONS

[1] US 2015/0154741
[2] DE 101 26 078 B4
[3] US 2006/0050981 A1
[4] Butts K, Crespigny A, Pauly J M, Moseley M. Diffusion-weighted interleaved echo-planar imaging with a pair of orthogonal navigator echoes Magn Reson Med 1996; 35:763-770.

LIST OF REFERENCE SIGNS

I Magnetic resonance image
I1, I2, In Segment images
IR Reference image
IR1, IR2, IRn Modified reference images
K1 First reconstruction kernel
K2.1, K2.2, K2.$n$ Second reconstruction kernels
P1, P2, Pn Phase images of the MR segment data records
R Reference spectrum (MR spectrum)
R1, R2, ..., Rn Modified reference spectra
R* Selected reference spectrum
S1, S2, Sn MR segment data records
S1.1, S1.2, S1.$n$ Preliminarily reconstructed MR segment data records
S2; S2.1, S2.2, S2.$n$ Finally reconstructed MR segment data records
Pt, Pt1, Pt2 Target points/voxels from the reference spectrum used for the kernel calculation
Pt1*, Pt2* Target points/voxels from the selected reference spectrum used for the kernel calculation
Ps, Ps1, Ps2 Reference points/voxels for which measurement values are available
n Number of MR segment data records used for the calculation of the second reconstruction kernel
N×M Number of copying steps when fully sampling k-space
q Number of the encoding steps of an MR segment data record

What is claimed is:

1. A method for generating a magnetic resonance image (I) of an object region, the magnetic resonance image having N×M image voxels, wherein N×M denotes a number of sampling steps in a fully sampled k-space, said method comprising:
  a) providing at least n magnetic resonance (MR) segment data records (S1, S2, ..., Sn), wherein n≥1, wherein each MR segment data record has N×M frequency voxels in k-space, each MR segment data record contains MR signal data for q frequency voxels and wherein, in each case, q<N×M and different MR segment data records contain MR signal data for different combinations of frequency voxels;
  b) calculating a first reconstruction kernel (K1) from a reference spectrum (R) of the object region;
  c) calculating n preliminarily reconstructed MR segment data records (S1.1, S1.2, ..., S1.$n$) by reconstructing data missing in a respective MR segment data record (S1, S2, ..., Sn) within a k-space region specified for each of the MR segment data records (S1, S2, ..., Sn) with the first reconstruction kernel (K1);
  d) calculating respective phase images (P1, P2, ..., Pn) from the preliminarily reconstructed MR segment data records (S1.1, S1.2, ..., S1.$n$) with a Fourier transform;
  e) calculating a reference image (IR), which has an absolute value, from the reference spectrum (R) with a Fourier transform;
  f) calculating n modified reference images (IR1, IR2, ..., IRn) by combining the absolute value of the reference image (IR) respectively with respective phases of each of the phase images (P1, P2, ..., Pn);
  g) calculating n modified reference spectra (R1, R2, ..., Rn) with a Fourier transform of each of the modified reference images (IR1, IR2, ..., IRn);
  h) calculating n second reconstruction kernels (K2.1, K2.2, ..., K2.$n$), wherein each second reconstruction kernel is ascertained from all modified reference spectra (R1, R2, ..., Rn) for each of the MR segment data records;
  i) ascertaining at least one finally reconstructed MR segment data record (S2; S2.1, S2.2, ..., S2.$n$) by reconstructing missing MR signal data of the MR segment data records (S1, S2, ..., Sn) with the second reconstruction kernels (K2.1, K2.2, ..., K2.$n$) and the MR signal data of the n MR segment data records (S1, S2, ..., Sn); and
  j) calculating the magnetic resonance image (I) from the at least one finally reconstructed MR segment data record (S2; S2.1, S2.2, ..., S2.$n$).

2. The method as claimed in claim 1, wherein
the calculation of the n second reconstruction kernels (K2.1, K2.2, ..., K2.$n$) is carried out with the modified reference spectra (R1, R2, ..., Rn) and additionally with a selected reference spectrum (R*) in said step h);
one single finally reconstructed MR segment data record (S2) is ascertained in said step i), and the magnetic resonance image (I) is generated in said step j) by a Fourier transform of the finally reconstructed MR segment data record (S2).

3. The method as claimed in claim 2, wherein
the selected reference spectrum (R*) is the reference spectrum (R) or one of the modified reference spectra (R1, R2, ..., Rn).

4. The method as claimed in claim 1, wherein
n finally reconstructed MR segment data records (S2; S2.1, S2.2, ..., S2.$n$) are ascertained in said step i), and
a segment image (I1, I2, ..., In) is initially generated in said step j) by a Fourier transform for each finally reconstructed MR segment data record (S2; S2.1, S2.2, ..., S2.$n$) and the segment images (I1, I2, ..., In) are subsequently combined to form the magnetic resonance image (I).

5. The method as claimed in claim 1, wherein said providing of the n MR segment data records (S1, S2, ..., Sn) in said step a) is implemented by recording at least one MR spectrum (S), wherein each MR spectrum (S) is recorded by scanning through the MR spectrum (S) with an excitation pulse in an MR sequence, in order to excite nuclear spins within the object region.

6. The method as claimed in claim 5, wherein
the MR spectrum (S) is recorded in said step a), and
the recorded MR spectrum (S) is stored and is subdivided into and provided as the MR segment data records (S1, S2, ..., Sn).

7. The method as claimed in claim 6, wherein
an Echo-Planar Imaging (EPI) sequence is used as the MR sequence and
the subdivision of the MR segment data records is implemented by subdividing MR signals in accordance with a sampling direction in k-space of the MR signals.

8. The method as claimed in claim 5, wherein a plurality of MR spectra are recorded with signal data for in each case less than M×N frequency voxels, and wherein different encodings are used for each of a plurality of excitation pulses.

9. The method as claimed in claim 1, wherein the specified k-space region in said step c) comprises all N×M frequency voxels.

10. The method as claimed in claim 1, wherein the specified k-space region in said step c) comprises a low-frequency portion of k-space.

11. The method as claimed in claim 1, wherein the specified k-space region in said step c) comprises portions of k-space in which the MR segment data record corresponding to the specified k-space has peaks.

12. The method as claimed in claim 1, wherein a movement of the object region between the recording of individual ones of the MR segment data records (S1, S2, ..., Sn) is corrected with the preliminarily reconstructed MR segment data records (S1.1, S1.2, ..., S1.*n*).

13. The method as claimed in claim 1, wherein the phase images (P1-Pn) are smoothed in said step d) with an x-space/image-space filter and/or wherein the preliminarily reconstructed MR segment data records (S1.1-S1.*n*) are smoothed in said step d) with a k-space filter.

14. The method as claimed in claim 6, wherein the MR spectrum (S) is recorded with signal data for N×M frequency voxels.

15. The method as claimed in claim 8, wherein n MR spectra are recorded with signal data for in each case less than M×N frequency voxels.

16. A method for generating a magnetic resonance image (I) of an object region, the magnetic resonance image having N×M image voxels, wherein N×M denotes a number of sampling steps in a fully sampled k-space, said method comprising:

aa) providing at least n magnetic resonance (MR) segment data records (S1, S2, ..., Sn), wherein n>1, wherein each MR segment data record has N×M frequency voxels in k-space, each MR segment data record contains MR signal data for q frequency voxels and wherein, in each case, q<N×M and different MR segment data records contain MR signal data for different combinations of frequency voxels;

bb) calculating a first reconstruction kernel (K1) from a reference spectrum (R) of the object region;

cc) calculating n preliminarily reconstructed MR segment data records (S1.1, S1.2, ..., S1.n) by reconstructing data missing in a respective MR segment data record (S1, S2, ..., Sn) within a k-space region specified for each of the MR segment data records (S1, S2, ..., Sn) with the first reconstruction kernel (K1);

dd) calculating respective phase images (P1, P2, ..., Pn) from the preliminarily reconstructed MR segment data records (S1.1, S1.2, ..., S1.n) with a Fourier transform;

ee) calculating a reference image (IR), which has an absolute value, from the reference spectrum (R) with a Fourier transform;

ff) calculating n modified reference images (IR1, IR2, ..., IRn) by combining the absolute value of the reference image (IR) respectively with respective phases of each of the phase images (P1, P2, ..., Pn);

gg) calculating n modified reference spectra (R1, R2, ..., Rn) with a Fourier transform of each of the modified reference images (IR1, IR2, ..., IRn);

hh) calculating n second reconstruction kernels (K2.1, K2.2, ..., K2.n), wherein each second reconstruction kernel is ascertained from all modified reference spectra (R1, R2, ..., Rn) for each of the MR segment data records;

ii) ascertaining at least one finally reconstructed MR segment data record (S2; S2.1, S2.2, ..., S2.n) by reconstructing missing MR signal data of the MR segment data records (S1, S2, ..., Sn) with the second reconstruction kernels (K2.1, K2.2, ..., K2.n) and the MR signal data of the n MR segment data records (S1, S2, ..., Sn);

jj) calculating new respective phase images (P1.2, P2.2, ..., Pn.2) from the finally reconstructed MR segment data records (S2; S2.1, S2.2, ..., S2.n) with a Fourier transform;

kk) repeating said steps ee) to ii) factoring in the new respective phase images (P1.2, P2.2, ... Pn.2);

ll) calculating the magnetic resonance image (I) from the at least one finally reconstructed MR segment data record (S2; S2.1, S2.2, ..., S2.n) factoring in the new respective phase images (P1.2, P2.2, ... Pn.2).

* * * * *